United States Patent
Lin et al.

(10) Patent No.: US 9,847,318 B2
(45) Date of Patent: Dec. 19, 2017

(54) MONOLITHIC STACKED INTEGRATED CIRCUITS WITH A REDUNDANT LAYER FOR REPAIRING DEFECTS

(71) Applicant: Taiwan Semiconductor Manufacturing Company, Ltd., Hsin-Chu (TW)

(72) Inventors: Kuan-Yu Lin, Hsinchu County (TW); Chin-Her Chien, Taoyuan County (TW); Ji-Jan Chen, Kaosiung (TW); Jung-Rung Jiang, Tao-Yuan (TW); Wei-Pin Changchien, Taichung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 4 days.

(21) Appl. No.: 15/043,912

(22) Filed: Feb. 15, 2016

(65) Prior Publication Data
US 2016/0163680 A1 Jun. 9, 2016

Related U.S. Application Data

(62) Division of application No. 14/068,187, filed on Oct. 31, 2013, now Pat. No. 9,269,640.

(51) Int. Cl.
| | |
|---|---|
| *H01L 23/58* | (2006.01) |
| *H01L 25/065* | (2006.01) |
| *H01L 21/768* | (2006.01) |
| *H01L 23/522* | (2006.01) |
| *H01L 21/66* | (2006.01) |
| *H01L 23/525* | (2006.01) |
| *H01L 23/48* | (2006.01) |

(52) U.S. Cl.
CPC .... *H01L 25/0657* (2013.01); *H01L 21/76892* (2013.01); *H01L 21/76895* (2013.01); *H01L 22/12* (2013.01); *H01L 22/14* (2013.01); *H01L 22/22* (2013.01); *H01L 23/525* (2013.01); *H01L 23/5226* (2013.01); *H01L 23/481* (2013.01); *H01L 2225/06541* (2013.01); *H01L 2924/0002* (2013.01)

(58) Field of Classification Search
CPC ............................ H01L 27/10; H01L 23/58
USPC .................................................. 257/48, 211
See application file for complete search history.

(56) References Cited

U.S. PATENT DOCUMENTS

| | | | |
|---|---|---|---|
| 7,307,001 B2 | 12/2007 | Lin et al. | |
| 8,362,482 B2 * | 1/2013 | Or-Bach | H01L 21/6835 257/103 |
| 8,448,100 B1 | 5/2013 | Lin et al. | |
| 8,587,102 B2 | 11/2013 | Leedy | |
| 8,631,372 B2 | 1/2014 | Yu et al. | |
| 8,669,780 B2 | 3/2014 | Chi | |
| 8,701,073 B1 | 4/2014 | Fu et al. | |
| 8,754,818 B2 | 6/2014 | Yen et al. | |

(Continued)

*Primary Examiner* — Caleb Henry
(74) *Attorney, Agent, or Firm* — Haynes and Boone, LLP

(57) ABSTRACT

Provided is a monolithic stacked integrated circuit (IC). The IC includes a first layer over a substrate and a second layer over the first layer. The first layer includes first circuit elements where a first portion of the first circuit elements has a defect. The second layer includes second circuit elements. The IC further includes interconnect elements coupling the first portion to a second portion of the second circuit elements for mitigating the defect.

20 Claims, 7 Drawing Sheets

(56) References Cited

U.S. PATENT DOCUMENTS

| | | | |
|---|---|---|---|
| 2008/0237591 A1* | 10/2008 | Leedy | B81B 7/02 |
| | | | 257/48 |
| 2012/0193621 A1* | 8/2012 | Or-Bach | H03K 19/17736 |
| | | | 257/48 |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0043148 A1 | 2/2014 | Wang et al. | |
| 2014/0077057 A1 | 3/2014 | Chao et al. | |
| 2014/0092939 A1 | 4/2014 | Chang et al. | |
| 2014/0126089 A1 | 5/2014 | Chang et al. | |
| 2014/0126274 A1 | 5/2014 | Lee et al. | |
| 2014/0167799 A1 | 6/2014 | Wang et al. | |
| 2014/0195728 A1 | 7/2014 | Hsu et al. | |
| 2014/0203397 A1 | 7/2014 | Yen et al. | |
| 2014/0211438 A1 | 7/2014 | Lin et al. | |
| 2014/0239427 A1 | 8/2014 | Huang et al. | |
| 2014/0264772 A1 | 9/2014 | Horng et al. | |
| 2014/0266273 A1 | 9/2014 | Wang et al. | |
| 2015/0048425 A1* | 2/2015 | Park | H01L 27/0207 |
| | | | 257/211 |

* cited by examiner

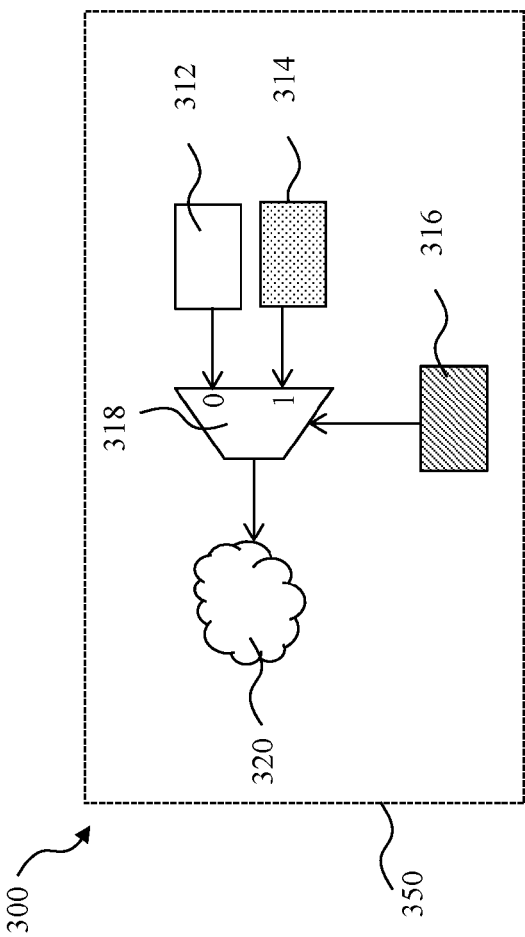
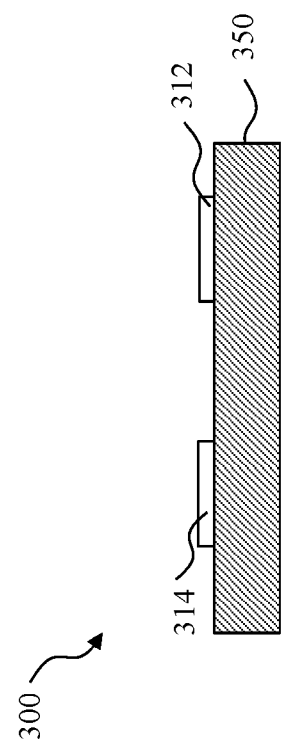

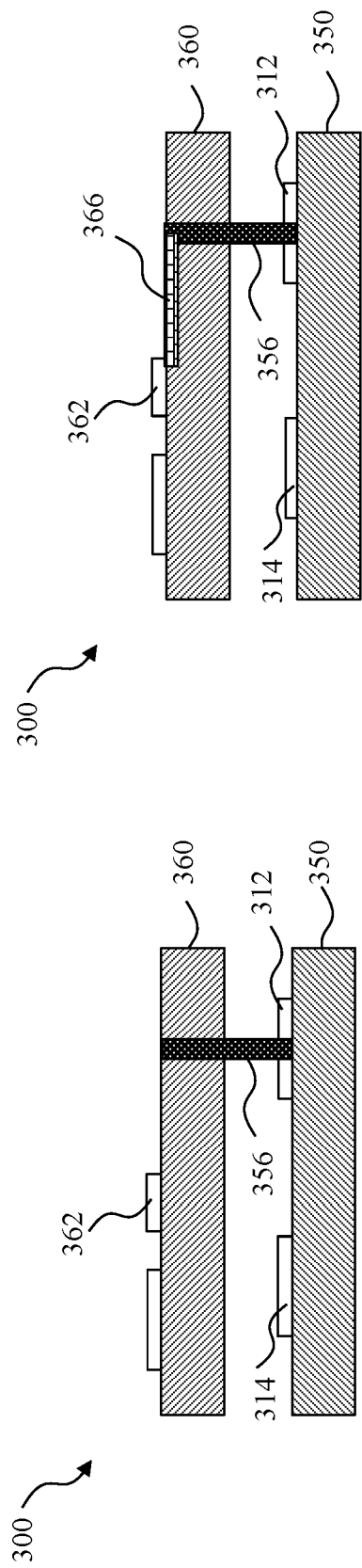

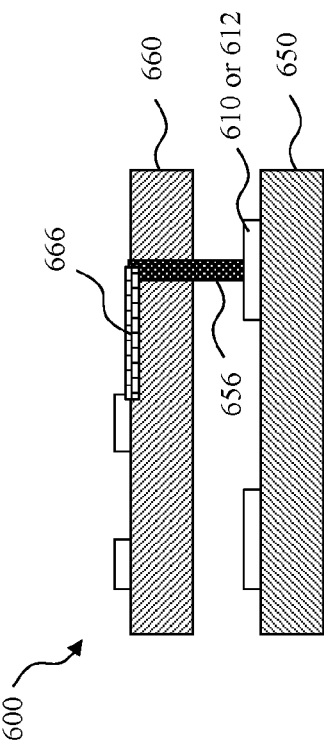
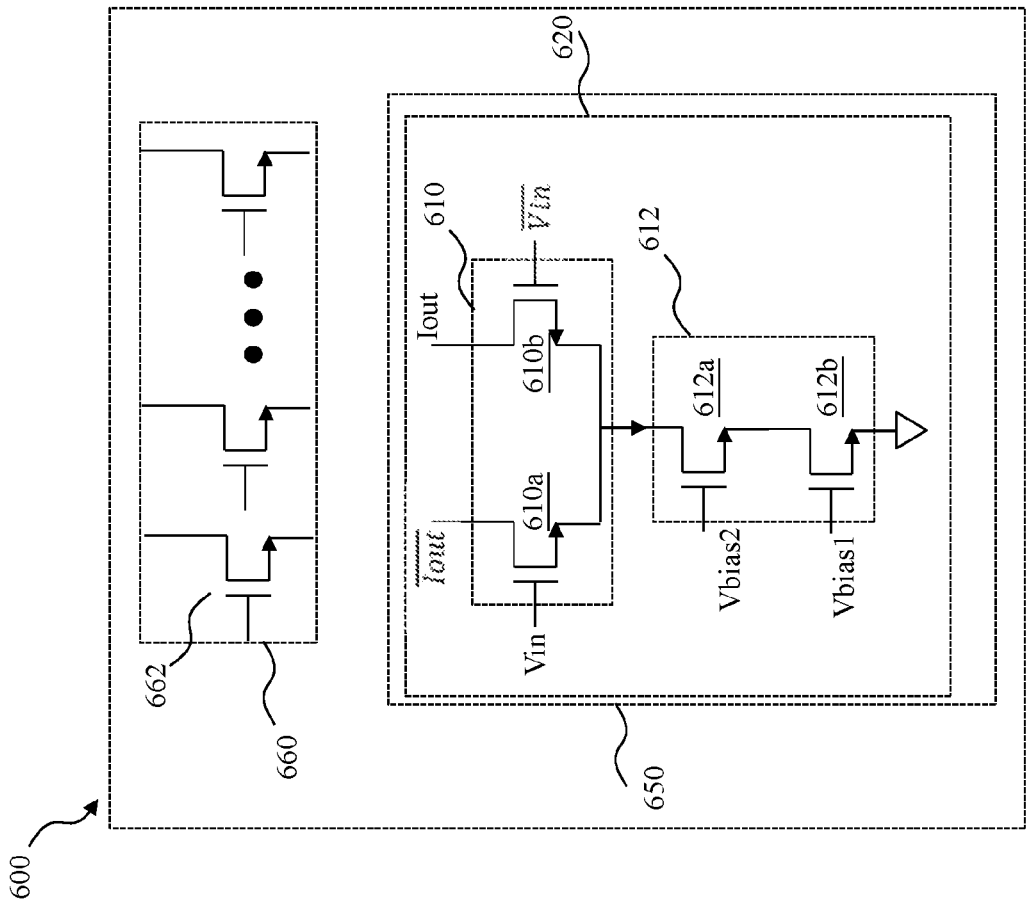
FIG. 6B
FIG. 6A

MONOLITHIC STACKED INTEGRATED CIRCUITS WITH A REDUNDANT LAYER FOR REPAIRING DEFECTS

PRIORITY

This is a divisional of U.S. application Ser. No. 14/068,187, filed Oct. 31, 2013, entitled "Repairing Monolithic Stacked Integrated Circuits with a Redundant Layer and Lithography Process," the entire disclosure of which is herein incorporated by reference.

BACKGROUND

Ongoing trends in semiconductor device technology include miniaturization of a feature size of semiconductor devices as well as increasing functional complexity of semiconductor devices. Although a feature size reduction may facilitate an increase in the number of semiconductor building blocks per unit area of a semiconductor device, e.g. a die or an integrated circuit (IC), thus facilitating more complex functionality per device, many demands for the increased functional complexity cannot be met by a single device.

This has led to the development of aggregate devices such as three-dimensional integrated circuits (3D ICs). One example of creating a 3D IC is by building electronic components and their connections in layers on a single semiconductor wafer. As a base layer of the IC is formed on a substrate, a first upper layer is formed over the base layer and is connected to the base layer using vias. Another upper layer may be formed over the first upper layer, and so on. In this way, the IC is sequentially grown layer by layer. An IC thus built is generally known as a monolithic stacked IC (or a stacked IC).

Though promising in providing density and performance benefits in advanced process nodes, such as 28 nm and below, the fabrication of monolithic stacked ICs has its own challenges. One of the challenges is directed to manufacture yields of monolithic stacked ICs, which are compounded by multiplying yields of each layer of the stacked ICs. As each layer may contain manufacturing defects, such as opens, shorts, and out-of-spec components, a stacked IC suffers a low yield issue. Other challenges include heat dissipation and electromagnetic interference (EMI) as more and more layers containing analog circuits and digital circuits are stacked into one IC.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, and 3D are embodiments of a portion of a monolithic stacked IC according to various aspects of the present disclosure.

FIGS. 6A and 6B are embodiments of a portion of a monolithic stacked IC according to various aspects of the present disclosure.

DETAILED DESCRIPTION

Figure 1:
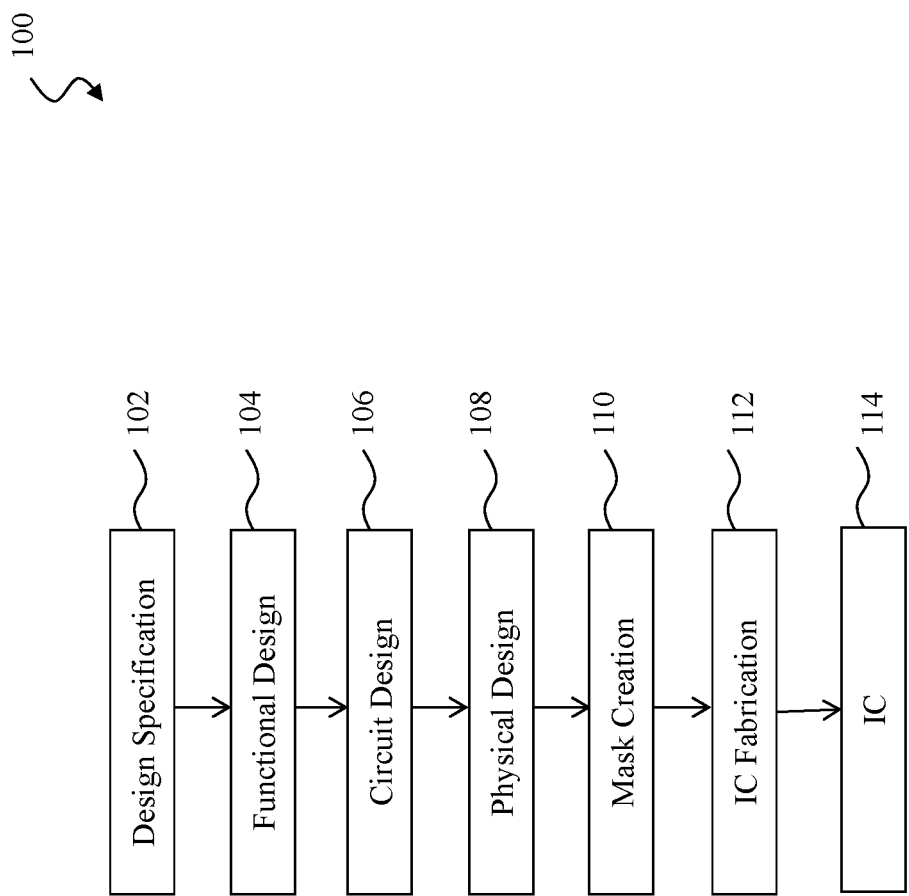
FIG. 1 is a simplified block diagram of an embodiment of an integrated circuit (IC) design and manufacturing flow.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Monolithic stacked ICs are promising in providing density and performance benefits in advanced process nodes. However, a low yield issue presents a big challenge as each layer of a stacked IC may not be defect-free. For example, if each layer in a 6-layer stacked IC has about 90% yield, the completed stacked IC has only around 50% yield which may be undesirably low. Monolithic stacked ICs face other issues. For example, as a stacked IC contains more and more layers, heat dissipation becomes problematic. Moreover, in a stacked IC that contains mixed analog and digital circuit layers, electromagnetic interference (EMI) becomes a prominent issue. The present disclosure relates generally to methods and apparatus of repairing layers of a stacked IC thereby increasing the yield of the stacked IC. The methods and apparatus can also be utilized to mitigate potential heat dissipation and EMI issues of the stacked IC. However, specific embodiments are provided as examples to teach the broader inventive concept, and one of ordinary skill in the art can easily apply the teaching of the present disclosure to other methods or apparatus.

FIG. 1 is a simplified block diagram of an embodiment of an integrated circuit (IC) design and manufacturing flow 100 to produce an IC 114. In the present embodiment, the IC 114 is a monolithic stacked IC that includes a base layer and one or more upper layers. The IC design flow 100 typically starts with a design specification 102 which includes the design requirements of the IC 114. It then proceeds to functional design 104 where the design of the IC 114 is partitioned into a plurality of layers and the plurality of layers interact to produce the desired embodiment.

The IC design flow 100 (FIG. 1) proceeds to circuit design 106. In an embodiment, the IC design is described in Register Transfer Level (RTL) language such as Verilog or VHDL and is subsequently synthesized into a netlist. In another embodiment, the IC design is described graphically in schematic. In an embodiment, the IC design includes not only circuits for the intended functionality of the IC 114, but also circuits for repairing the IC 114 during IC fabrication 112. For the sake of simplicity, in the following discussion, the circuits for the intended functionality of the IC 114 are called functional circuits, while the circuits for repairing the IC 114 during IC fabrication 112 are called redundant circuits. In an embodiment, a portion of functional circuits may be identified as critical paths of the IC 114 as they play critical roles in determining the performance, such as an operating speed, of the IC 114. Redundant circuits may include discrete circuit components. In an embodiment, redundant circuits include a plurality of digital standard cells, such as flip-flops, memory cells, inverters, multiplexers, logic gates such as AND, OR, NAND, and other types of standard cells. In an embodiment, redundant circuits include passive or active analog circuit components such as capacitors, resistors, field effect transistors (FET), metal oxide semiconductor field effect transistors (MOSFET), and other types of circuit components. Redundant circuits do not perform functions for the IC 114 except when they are connected to the functional circuits during a repairing process. This point will be described in further detail in later sections of the present disclosure.

The IC design flow 100 (FIG. 1) proceeds to physical design 108 where an IC design layout is produced. The IC design layout includes various geometrical patterns designed for the IC 114. The geometrical patterns correspond to patterns of metal, oxide, or semiconductor material layers that make up the various components of the IC device 114 to be fabricated. The various material layers combine to form various IC features in each layer of the IC 114. For example, a portion of the IC design layout includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The IC design layout includes both the functional circuits and the redundant circuits of the IC 114. In an embodiment, the functional circuits of the IC 114 are included in one or more layers, called functional layers, while the redundant circuits of the IC 114 are included in one or more layers, called redundant layers. The functional layers further include inter-layer vias (ILV) or other types of interconnects that couple portions of the functional circuits to the redundant layers for purposes of repairing the functional circuits. In an embodiment, a layer may include both functional circuits and redundant circuits where the redundant circuits are used to repair layers thereunder. The IC design layout is presented in one or more data files having information of the geometrical patterns. For example, the IC design layout can be expressed in a GDSII file format or DFII file format.

With the IC design layout, the IC design flow 100 (FIG. 1) proceeds to mask creation 110 to produce one or more masks to be used for fabricating the various layers of the IC product according to the IC design layout. The mask creation 110 includes various tasks such as mask data preparation, where the IC design layout is translated into a form that can be physically written by a mask writer, and mask fabrication, where the design layout prepared by the mask data preparation is modified to comply with a particular mask writer and/or mask manufacturer and is then fabricated.

After the mask (or masks) has been fabricated, the IC design flow 100 (FIG. 1) proceeds to IC fabrication 112. The IC fabrication may be done by a myriad of manufacturing facilities. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

In an embodiment, a semiconductor wafer is fabricated using the mask (or masks) to form the IC device 114. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). In the present embodiment, the IC device 114 includes a base layer formed over a substrate and a plurality of upper layers formed over the base layer. The base layer and the plurality of upper layers may be inter-connected using inter-layer vias (ILV).

Forming an upper layer of the IC 114 may be done by a variety of processes. In an embodiment, a process of forming an upper layer over a base layer starts with receiving a new wafer (a donor wafer), constructing dopant regions in a top layer of the new wafer and activating the dopant regions at a high temperature, such as about 1000 degree Celsius. The process then proceeds to implanting hydrogen into the dopant regions for cutting the dopant regions at a later step, bonding the new wafer to the base layer with the dopant regions directly over the base layer and performing an ion cut process to the new wafer thereby leaving a thin layer of dopant regions over the base layer. The process then proceeds to forming shallow trench isolations (STI) in the thin layer of dopant regions for defining isolation regions for inter-layer vias and for defining active regions for devices, such as recess channel array transistors (RCATs). In an embodiment, forming STI regions includes etching shallow trenches in the dopant regions, depositing a dielectric material layer, such as oxide, into the shallow trenches and over the dopant regions and performing a chemical-mechanical polishing (CMP) process to the dielectric material layer. The process of forming the upper layer then proceeds to etching gate regions within the active regions defined by the STI regions, forming gate oxide and forming gate electrode. The process further includes forming interconnect structures within the upper layer as well as between the upper layer and the base layer. In an embodiment, a process of forming interconnect structures includes forming a dielectric material layer over the STI and active regions of the upper layer, performing a CMP process to the dielectric material layer, etching the dielectric material layer and/or the STI regions to form inter-layer vias and/or RCAT contact trenches, depositing conducting materials, such as copper, into the vias and/or trenches and performing another CMP process to the conducting materials As each layer of the IC 114 is fabricated, the IC 114 is tested incrementally for manufacturing defects, and, if found defective, may be repaired according to various aspects of the present disclosure.

After being fabricated and tested fault free, the IC 114 devices typically go through a packaging and further testing process before being delivered to market.

Figure 2:
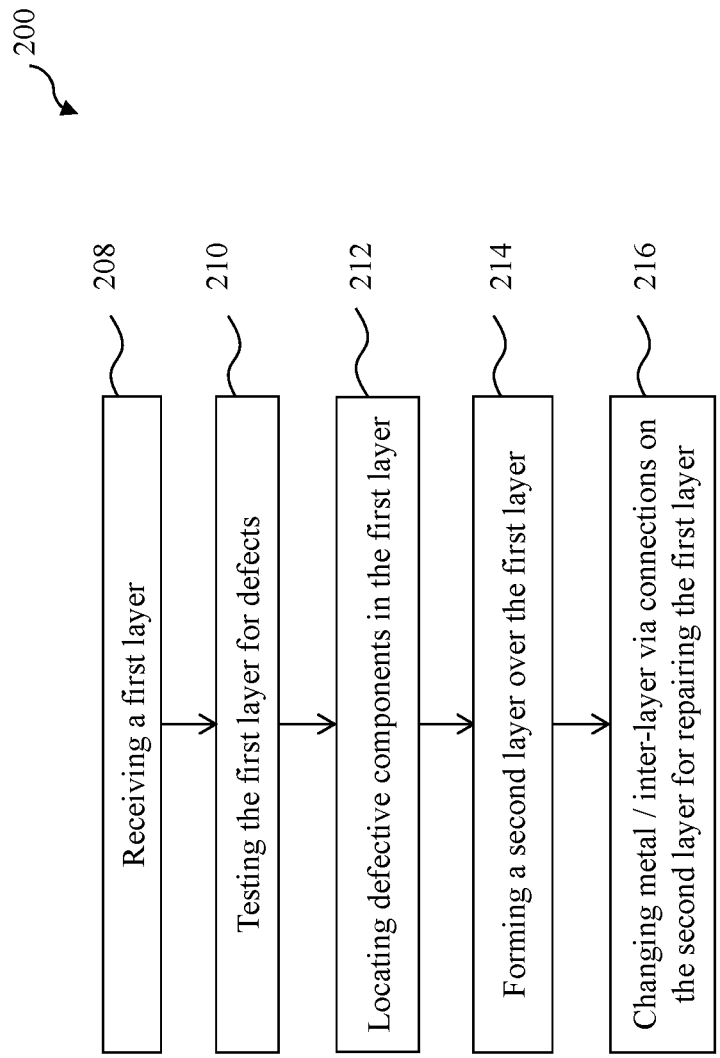
FIG. 2 is a flow chart of repairing a monolithic stacked IC according to various aspects of the present disclosure.

FIG. 2 illustrates a method 200 of testing and repairing a stacked IC, such as the IC 114, as it is fabricated during IC fabrication 112, according to various aspects of the present disclosure. FIG. 2 may be best understood in conjunction with FIGS. 3A-3D.

The method 200 (FIG. 2) begins with operation 208 where a first layer 350 of an exemplary stacked IC 300 (FIG. 3A) is received or formed. Referring to FIG. 3A, the first layer 350 may be a base layer formed in a silicon substrate. Alternatively, the first layer 350 may be an upper layer formed over a base layer or another upper layer of the stacked IC 300. The first layer 350 may be formed using methods aforementioned, or by other suitable methods. In the present embodiment, the first layer 350 is a functional layer of the stacked IC 300. Furthermore, the first layer 350 contains a plurality of digital circuit components from a standard cell library and a portion of the circuit components and/or functional paths have been identified as critical paths of the stacked IC 300. These critical paths are further designed to have connections to a redundant layer to be fabricated in a later step for repairing purposes. To further illustrate this point, FIG. 3B shows a logical representation of a portion of the layer 350 containing a critical path.

Referring to FIG. 3B, the stacked IC 300, more specifically the first layer 350, includes a critical path 314 as an input to a logic cloud 320. To be able to repair the critical path 314 in case that it contains defects upon fabrication, a multiplexer 318 is inserted between the critical path 314 and the logic cloud 320. One data input of the multiplexer 318 is coupled to an output of the critical path 314; another data input of the multiplexer 318 is coupled to a redundant element 312; an output of the multiplexer 318 is coupled to the logic cloud 320; and a selection input of the multiplexer 318 is coupled to a control element 316. In the present embodiment, the redundant element 312 includes an inter-layer via (ILV) that couples the redundant element 312 with a redundant layer to be fabricated over the first layer 350. In an embodiment, the control element 316 is a register-based or memory-based element controllable through an interface of the stacked IC 300, such as a micro-processor interface, an IEEE 1149.1 interface, and an IEEE 1500 interface. In another embodiment, the control element 316 includes an inter-layer via (ILV) that couples the control element 316 with the redundant layer and may be permanently fixed to either a low or a high logic value on the redundant layer. The control element 316 selects either the critical path 314 in the first layer 350 or some other circuits residing in the redundant layer coupled with the redundant element 312. A critical path thus multiplexed for repairing purposes, such as the critical path 314, is referred to as a redundancy multiplexed critical path in the present disclosure.

The method 200 (FIG. 2) proceeds to operation 210 where the first layer 350 is tested for defects. The first layer 350 may be tested by a variety of manufacturing test methods. For example, the first layer 350 may be tested for power supply opens or shorts, ground opens or shorts, stuck-at faults, current consumption faults (e.g., IDDQ), timing path delay faults (or transition faults), etc. Furthermore, the first layer 350 may be tested with a suite of test vectors that uncover functional defects. The first layer 350 may be tested standalone. Alternatively, the first layer 350 may be tested in conjunction with one or more layers underneath the first layer 350 which have been fabricated.

If the first layer 350 is defective, the method 200 (FIG. 2) proceeds to operation 212 to locate a plurality of defects based on the operation 210, such as defective circuit components and/or defective functional paths. Particularly, operation 212 determines whether a defect is repairable, such as by a redundant element in a later operation (operation 216). If it is not repairable, the stacked IC 300 can be removed from further manufacturing process thereby to save processing and/or manufacturing cost. If removing of the stacked IC 300 is not possible or is not cost-effective, the particular IC/die location can be marked defective and no further testing is performed on that location in future processing and testing steps thereby saving test costs.

If the first layer 350 is found to be defect-free or substantially defect-free, i.e. having acceptable defects, the method 200 may skip operation 212. In an embodiment, the operations 210 and 212 may be combined into one operation.

For the purpose of illustrating the inventive concept of the present disclosure, the first layer 350 is found to be defective and there is a defect in the redundancy multiplexed critical path 314.

The method 200 (FIG. 2) proceeds to operation 214 to form a second layer 360 over the first layer 350 (FIG. 3C). In an embodiment, the second layer 360 is another functional layer, such as the first layer 350, but further includes interconnect structures to extend the redundant element 312 through the second layer 360. In the present embodiment, the second layer 360 is a redundant layer for repairing at least the first layer 350. The redundant layer 360 may or may not be in direct contact with the first layer 350 as long as the redundant element 312 is connected to the redundant layer 360. Certain factors may be considered in determining how many functional layers, such as the first layer 350, are formed before forming the redundant layer 360. For example, one factor may be the circuit density of the redundant layer and the number of redundancy multiplexed critical paths in the functional layers to be repaired. For example, one factor may be a need for improved heat dissipation as the redundant layer 360 generally has high metal density and may serve as a good heat sink. For example, one factor may be a need for EMI reduction if the stacked IC 300 includes mixed high frequency analog and digital circuits.

Referring again to FIG. 3C, in the present embodiment, the redundant layer 360 includes a plurality of circuit components from standard cell libraries. Specifically, one or more of the circuit components, 362, can be a replacement for the critical path 314, but have not yet been connected to the functional layer 350. An inter-layer via (ILV) 356 has been formed to connect the redundant element 312 to the redundant layer 360.

The method 200 (FIG. 2) proceeds to operation 216 to modify the redundant layer 360 for repairing the functional layer 350. Referring to FIG. 3D, modifying the redundant layer 360 includes forming an interconnect structure 366 coupling the ILV 356 with the circuit component 362. In the present embodiment, the operation 216 is accomplished using a system having an electron beam (e-beam) direct-writing technology, such as system 400 illustrated in FIG. 4, although alternative methods or systems may be used, such as ion-beam writing, optical writing, and molecular imprint.

Figure 4:
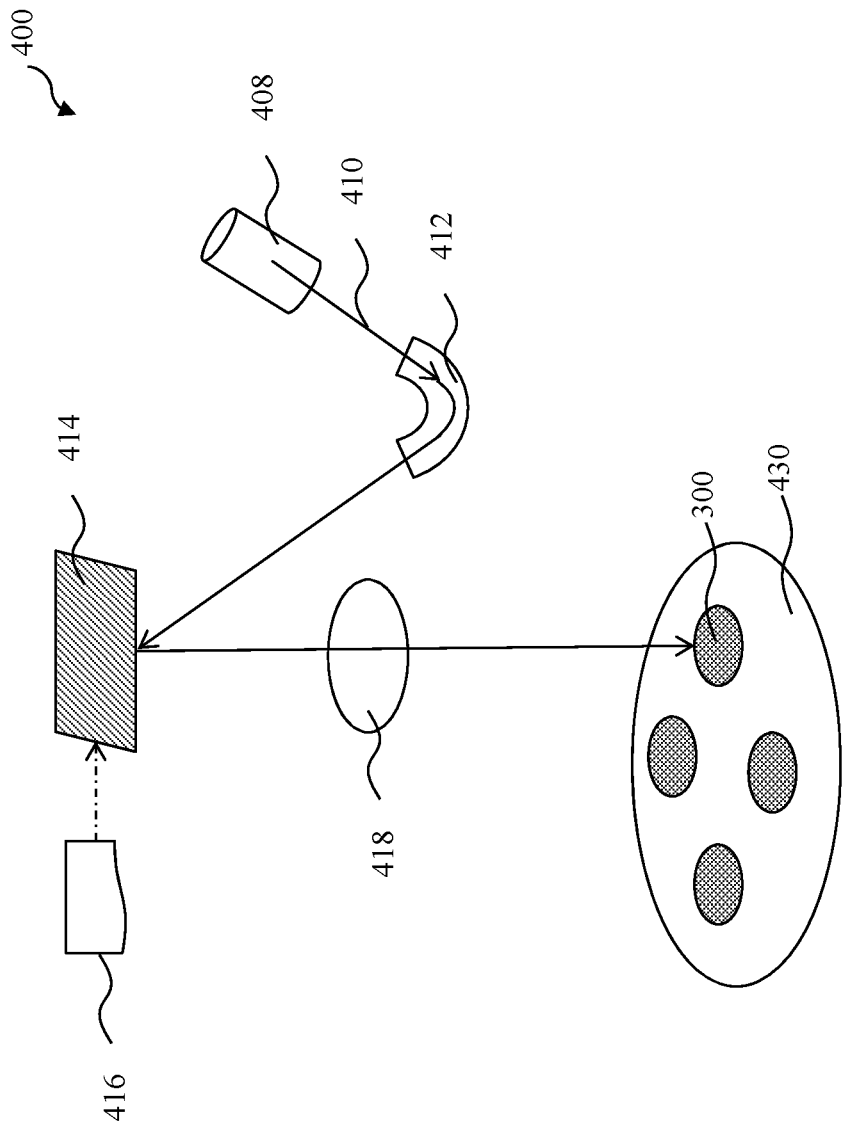
FIG. 4 illustrates an embodiment of a system for repairing a monolithic stacked IC according to various aspects of the present disclosure.

Referring to FIG. 4, the system 400 includes an electron source 408 which generates an e-beam 410, a beam-bender 412, a digital pattern generator (DPG) 414 which takes as input a data file 416, projection optics 418, and a rotary stage 430 which holds and aligns a plurality of wafers for proper exposure. One of the wafers includes the stacked IC 300 having the redundant layer 360 which is coated with a photoresist layer prior to the exposure. The photoresist layer may be a positive type or a negative type. The stacked IC 300 may be cleaned before and/or soft-baked after the photoresist coating. The data file 416 is based on the design layout of the redundant layer 360 and any modifications to be made thereon as determined by operations 210 and 212. The data file 416 is in a format accessible by the DPG 414. The DPG 414 either reflects or absorbs the e-beam 410 based on the data file 416 thereby only a portion of the photoresist layer over the redundant layer 360 is exposed for patterning the photoresist layer. After the exposure, further steps are conducted to form the interconnect structure 366 using a lithography process. For example, the stacked IC 300 may undergo post-exposure baking, developing, and hard-baking processes thereby forming patterns in the photoresist layer. The redundant layer 360 is etched to form trench patterns using the patterned photoresist layer as an etch mask. The etching process may include dry etching, wet etching, or other etching techniques. The photoresist layer is subsequently stripped by a proper method such as wet stripping or plasma ashing. A conductive material, such as copper, is deposited into the trench patterns and may be subsequently polished by a suitable process such as a chemical mechanical polishing (CMP) to form the interconnect structure 366. Other suitable processes may be performed to the redundant layer 360 thereafter, such as oxidation. Since a direct-writing method is used, a costly repair mask is eliminated, i.e. it is a maskless repairing method.

After the stacked IC 300 has been repaired by the operation 216 (FIG. 2), it may be sent to the next process in the normal processing flow. For example, more layers may be formed over the redundant layer 360. For example, if the redundant layer 360 is the topmost layer of the stacked IC 300, an IC-level testing may be performed to the stacked IC 300.

Figure 5B:
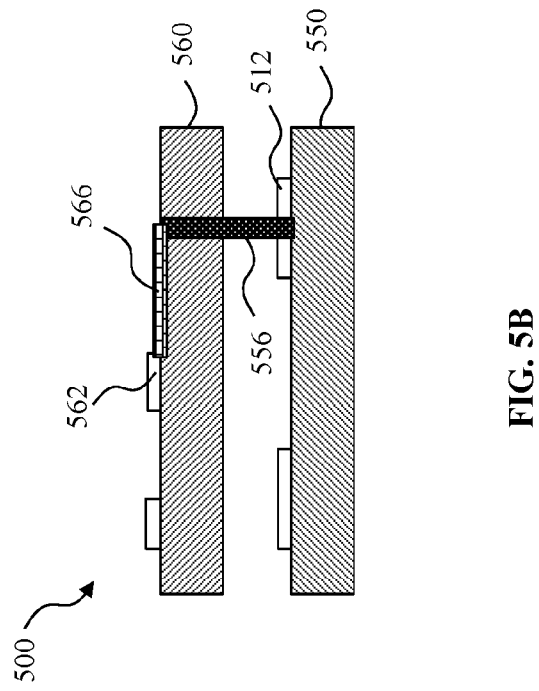
FIGS. 5A and 5B are embodiments of a portion of a monolithic stacked IC according to various aspects of the present disclosure.
Figure 5A:
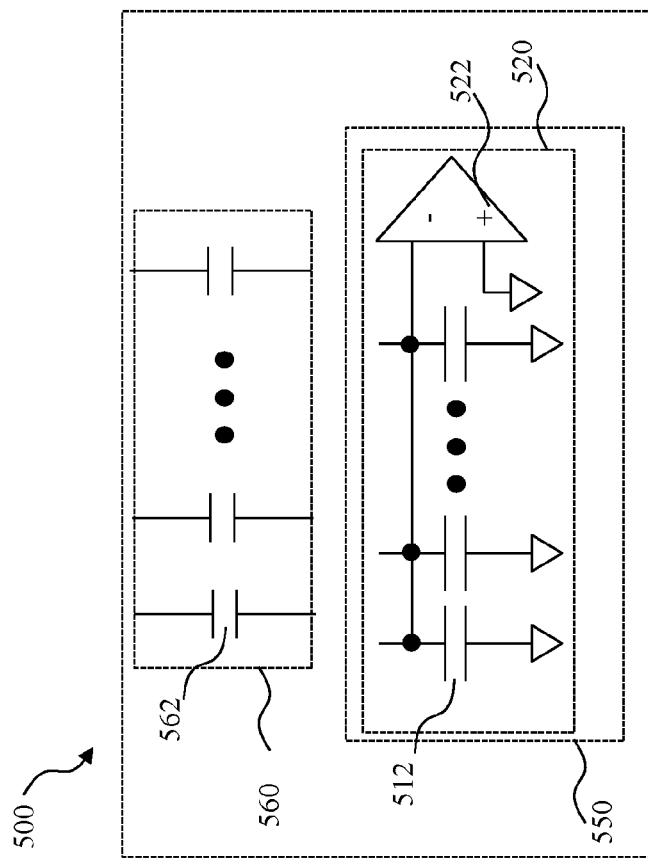

FIGS. 5A and 5B illustrate another exemplary stacked IC 500 which may be repaired by the methods and systems discussed above. Referring to FIG. 5A, the stacked IC 500 includes a functional layer 550 and a redundant layer 560. In the present embodiment, the functional layer 550 includes a plurality of analog circuits, such as a charge-redistribution successive approximation analog-to-digital converter (ADC) 520. The ADC 520 includes a plurality of capacitors 512, a comparator 522, and other proper elements. In the present embodiment, the resolution of the ADC 520 largely depends on the capacitors 512 matching a set of specified values or matching with respect to each other. The functional layer 550 further includes interconnect structures, such as ILVs, coupling both terminals of each of the capacitors 512 to the redundant layer 560. The redundant layer 560 includes a plurality of capacitors 562. In the present embodiment, the capacitors 562 have much smaller and finer capacitance compared with the capacitors 512 such that one or more capacitors 562 may be connected to one (or more) of the capacitors 512 in parallel in order to make up any capacitance mismatch in the ADC 520.

Referring to FIG. 5B, the stacked IC 500 has undergone a process flow according to an embodiment of the method 200 (FIG. 2), which is briefly described below in conjunction with FIG. 2. At operation 208, the functional layer 550 is received or formed. At operations 210 and 212, the functional layer 550 is tested. Particularly, the capacitors 512 are measured and an offset (or mismatch) of each of the capacitors 512 is recorded. At operation 214, the redundant layer 560 is formed over the functional layer 550. Particularly, inter-layer vias (ILV) 556 are formed coupling both terminals of each of the capacitors 512 to the redundant layer 560, although the terminals are not yet connected to any of the capacitors 562. At operation 216, a direct-writing system, such as the system 400 (FIG. 4) is utilized in a photolithography process to locally modify the redundant layer 560 to form interconnect structures 566 in the redundant layer. The capacitance mismatch recorded in operations 210 and 212 may be used to derive a portion of the data file 416 (FIG. 4). The interconnect structures 566 connect one or more capacitors 562 to one or more capacitors 512 so that the ADC 520 has enhanced resolution.

FIGS. 6A and 6B illustrate another exemplary stacked IC 600 which may be repaired by the methods and systems discussed above. Referring to FIG. 6A, the stacked IC 600 includes a functional layer 650 and a redundant layer 660. In the present embodiment, the functional layer 650 includes a digital-to-analog converter (DAC) 620 and may include other analog circuits. The DAC 620 includes a differential current switch 610, a current source 612, and other proper elements. The differential current switch 610 includes a pair of metal oxide semiconductor field effect transistors (MOSFET) 610a and 610b. The current source 612 includes a pair of MOSFETs 612a and 612b. In the present embodiment, the MOSFETs 610a and 610b generally need to match each other in order for the differential current switch 610 to provide a balanced signal swing. In another embodiment, the DAC 620 may be one unit (or one bit) in a binary weighted current steering DAC and the MOSFETs 612a and 612b need to match a design specification, such as amount of sourcing current, with respect to other units in the DAC 620. The functional layer 650 further includes interconnect structures, such as ILVs, coupling all terminals of the MOSFETs 610a, 610b, 612a and 612b to the redundant layer 660 which includes a plurality of MOSFETs 662. In the present embodiment, the MOSFETs 662 are smaller in size compared to the MOSFETs in the functional layer 650 therefore the MOSFETs 662 may compensate MOSFETs 610a, 610b, 612a and 612b. For example, if the MOSFETs 612a and 612b are found to source a current smaller than a specified value, one or more MOSFETs 662 may be connected to the MOSFETs 612a and 612b in parallel to increase its current sourcing capacity.

Referring to FIG. 6B, the stacked IC 600 has undergone a process flow according to an embodiment of the method 200 (FIG. 2), which is briefly described below in conjunction with FIG. 2. At operation 208, the functional layer 650 is received or formed. At operations 210 and 212, the functional layer 650 is tested. Particularly, the MOSFETs 610a, 610b, 612a and 612b are measured and an offset (or mismatch) of each MOSFET is recorded. At operation 214, the redundant layer 660 is formed over the functional layer 650. Particularly, inter-layer vias (ILV) 656 are formed coupling all terminals of the MOSFETs 610a, 610b, 612a and 612b to the redundant layer 660, although the terminals are not yet connected to any of the MOSFETs 662. At operation 216, a direct-writing system, such as the system 400 (FIG. 4) is utilized in a photolithography process to locally modify the redundant layer 660 to form interconnect structures 666 in the redundant layer. The MOSFET mismatch recorded in operations 210 and 212 may be used to derive a portion of the data file 416 (FIG. 4). The interconnect structures 666 connect one or more MOSFETs 662 to one or more MOSFETs 610a, 610b, 612a and 612b so as to enhance the performance of the DAC 620, such as balanced differential output and/or improved resolution.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a monolithic stacked integrated circuit (IC). The IC includes a first layer over a substrate and a second layer over the first layer. The first layer includes a first plurality of circuit elements and a first portion of the first plurality of circuit elements has defects. The second layer includes a second plurality of circuit elements. The IC further includes interconnect elements coupling the first portion to a second portion of the second plurality of circuit elements for mitigating the defects.

In another exemplary aspect, the present disclosure is directed to a method for repairing a first functional layer in a monolithic stacked integrated circuit (IC), wherein the first functional layer includes a first circuit element that fails a target specification, and further includes conductive means for coupling the first circuit element to a redundant layer. The method includes forming the redundant layer over the first functional layer, wherein the redundant layer includes second circuit elements and inter-layer vias (ILV) that are coupled to the conductive means. The method further includes deriving a data file from at least a design layout of the redundant layer, the first circuit element, and the target specification. The method further includes performing a direct-writing lithography process to the redundant layer with the data file thereby forming conductive features in the redundant layer. The conductive features couple a portion of the second circuit elements to the ILVs such that the portion of the second circuit elements, the conductive features, the ILVs, the conductive means, and the first circuit element collectively meet the target specification.

In another exemplary aspect, the present disclosure is directed to a method for fabricating a monolithic stacked integrated circuit (IC), wherein the IC includes a plurality of functional layers and a redundant layer for repairing at least a portion of the plurality of functional layers. The method includes: (a) receiving a substrate; (b) forming one of the functional layers over the substrate; (c) testing a plurality of critical circuits in the functional layer for defects; (d) upon a condition in which the plurality of critical circuits is defective, locating defective circuit components in the plurality of critical circuits; (e) repeating the steps (b), (c) and (d) until the plurality of functional layers are formed, wherein each functional layer includes inter-layer vias (ILV) for coupling the plurality of critical circuits thereunder to the redundant layer; and (f) forming the redundant layer over the plurality of functional layers.

What is claimed is:

1. A monolithic stacked integrated circuit (IC), comprising:
    a first layer over a substrate, the first layer having a first circuit element, the first circuit element deviating from a target specification;
    a second layer over the first layer, the second layer having a second circuit element; and
    interconnect elements, the interconnect elements coupling terminals of the first circuit element to terminals of the second circuit element, wherein the first and second circuit elements collectively improve over the first circuit element towards the target specification, wherein:
    the first circuit element includes a first analog circuit element;
    the second circuit element includes a second analog circuit element;
    the first and second analog circuit elements are of the same type;
    terminals of the first analog circuit element are coupled to respective terminals of the second analog circuit element by the interconnect elements; and
    the first and second analog circuit elements collectively improve over the first analog circuit element towards the target specification.

2. The IC of claim 1, wherein the first layer is a base layer of the IC.

3. The IC of claim 1, wherein the second layer is in direct contact with the first layer.

4. The IC of claim 1, wherein the first and second analog circuit elements are passive analog circuits.

5. The IC of claim 4, wherein the second analog circuit element has a smaller resistance, a smaller capacitance, or a smaller inductance than the first analog circuit element.

6. The IC of claim 1, wherein the first and second analog circuit elements include field effect transistors (FET).

7. The IC of claim 1, wherein the substrate includes silicon.

8. The IC of claim 1, wherein the interconnect elements include inter-layer vias.

9. A monolithic stacked integrated circuit (IC), comprising:
    a first layer over a substrate, the first layer having first circuit elements, the first circuit elements including a functional element, a redundant element, a multiplexer, and a control element, the functional element failing a target function, wherein the multiplexer includes a first data input coupled to an output of the functional element, a second data input coupled to an output of the redundant element, and a selection input coupled to the control element;
    a second layer over the first layer, the second layer having second circuit elements that collectively perform the target function; and
    a first interconnect element, the first interconnect element coupling an input of the redundant element to the second circuit elements.

10. The IC of claim 9, further comprising:
a second interconnect element, the second interconnect element coupling the control element to another circuit element in the second layer such that the functional element is bypassed.

11. The IC of claim 9, wherein the first interconnect element includes an inter-layer via.

12. A monolithic stacked integrated circuit (IC), comprising:
a first layer over a substrate, the first layer having a first analog circuit element, the first analog circuit element deviating from a target specification;
a second layer over the first layer, the second layer having a second analog circuit element that is of the same type as the first analog circuit element; and
interconnect elements, the interconnect elements coupling terminals of the first analog circuit element to respective terminals of the second analog circuit element such that the first analog circuit element, the second analog circuit element, and the interconnect elements collectively meet the target specification.

13. The IC of claim 12, wherein each of the first and second analog circuit elements is a capacitor.

14. The IC of claim 13, wherein the second analog circuit element has a smaller capacitance than the first analog circuit element.

15. The IC of claim 12, wherein the first and second analog circuit elements are field effect transistors (FET) and the second analog circuit element is configured to source a smaller current than the first analog circuit element does.

16. The IC of claim 9, wherein the control element is a register-based or memory-based element.

17. The IC of claim 9, wherein the control element is coupled to the second layer through an inter-layer via.

18. The IC of claim 9, wherein the control element is configured to be programmed using one of a micro-processor interface, an IEEE 1149.1 interface, and an IEEE 1500 interface.

19. The IC of claim 12, wherein both the first and second analog circuit elements include resistors, inductors, capacitors, or transistors.

20. The IC of claim 9, wherein the second layer is in direct contact with the first layer.

* * * * *